(12) United States Patent
Jung et al.

(10) Patent No.: US 12,721,003 B2
(45) Date of Patent: Aug. 25, 2026

(54) DISPLAY DEVICE AND MANUFACTURING METHOD THEREOF

(71) Applicant: Samsung Display Co., LTD., Yongin-si (KR)

(72) Inventors: Suk Won Jung, Yongin-si (KR); Young Do Kim, Yongin-si (KR); Won Jin Kim, Yongin-si (KR); Jun Woo You, Yongin-si (KR); Won Beom Lee, Yongin-si (KR); Jeong Seok Lee, Yongin-si (KR); Chang Moo Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 338 days.

(21) Appl. No.: 18/624,524

(22) Filed: Apr. 2, 2024

(65) Prior Publication Data

US 2025/0089522 A1 Mar. 13, 2025

(30) Foreign Application Priority Data

Sep. 7, 2023 (KR) ........................ 10-2023-0119120

(51) Int. Cl.
*H10K 59/80* (2023.01)
*H10K 71/13* (2023.01)
*H10K 102/00* (2023.01)

(52) U.S. Cl.
CPC ....... *H10K 59/872* (2023.02); *H10K 59/8792* (2023.02); *H10K 71/135* (2023.02); *H10K 2102/351* (2023.02)

(58) Field of Classification Search
None
See application file for complete search history.

(56) References Cited

U.S. PATENT DOCUMENTS

| | | | | |
|---|---|---|---|---|
| 2023/0280507 | A1 | 9/2023 | Kim et al. | |
| 2025/0089522 | A1* | 3/2025 | Jung .................... | H10K 59/872 |

FOREIGN PATENT DOCUMENTS

| | | |
|---|---|---|
| KR | 10-0888048 | 3/2009 |
| KR | 10-2154522 | 9/2020 |
| KR | 10-2020-0129646 | 11/2020 |
| KR | 10-2022-0019500 | 2/2022 |
| KR | 10-2022-0080862 | 6/2022 |
| KR | 10-2023-0130196 | 9/2023 |
| WO | 2014/208930 | 12/2014 |

* cited by examiner

*Primary Examiner* — Jack S Chen
(74) *Attorney, Agent, or Firm* — Lerner David LLP

(57) ABSTRACT

A display device includes a display panel including a pressed area, a non-pressed area, and an alignment mark area defined on a rear surface overlapping the pressed area, a driving chip disposed on a front surface of the display panel overlapping the pressed area, and a cover panel disposed on the rear surface of the display panel. The cover panel includes a first functional layer disposed on the rear surface of the display panel overlapping the non-pressed area, a second functional layer disposed on the first functional layer, extending along the first functional layer, and disposed on the rear surface of the display panel overlapping the pressed area, and a third functional layer disposed on the second functional layer overlapping the pressed area.

20 Claims, 7 Drawing Sheets

PA
NPA
ID
UV
INK1
310
AM1
100
100R
100F

DISPLAY DEVICE AND MANUFACTURING METHOD THEREOF

CROSS-REFERENCE TO RELATED APPLICATION(S)

This application claims priority to and the benefit of Korean Patent Application No. 10-2023-0119120 under 35 U.S.C. § 119, filed on Sep. 7, 2023, in the Korean Intellectual Property Office (KIPO), the entire content of which are incorporated herein by reference.

BACKGROUND

1. Technical Field

The disclosure relates to a display device and a manufacturing method of the display device.

2. Description of the Related Art

As information technology develops, the importance of a display device as a connection medium between a user and information is being emphasized. In response to this, the use of display devices such as a liquid crystal display device and an organic light emitting display device is increasing.

SUMMARY

The disclosure provides a display device that can have a thin thickness and improved light blocking and impact resistance properties, and a manufacturing method of the display device.

The disclosure provides a display device that can readily align a display panel and a driving chip, and a manufacturing method of the display device.

The disclosure provides a display device that can prevent cracks in a display panel when a driving chip is pressed to the display panel, and a manufacturing method of the display device.

The technical objectives to be achieved by the disclosure are not limited to those described herein, and other technical objectives that are not mentioned herein would be clearly understood by a person skilled in the art from the description of the disclosure.

According to an embodiment of the disclosure, a display device may include a display panel including a pressed area, a non-pressed area, and an alignment mark area defined on a rear surface overlapping the pressed area; a driving chip disposed on a front surface of the display panel overlapping the pressed area; and a cover panel disposed on the rear surface of the display panel. The cover panel may include a first functional layer disposed on the rear surface of the display panel overlapping the non-pressed area; a second functional layer disposed on the first functional layer, extending along the first functional layer, and disposed on the rear surface of the display panel overlapping the pressed area; and a third functional layer disposed on the second functional layer overlapping the pressed area.

The first functional layer may not overlap the pressed area.

The first functional layer may include an acrylic resin, a photoinitiator, and a light blocking material.

An optical density value of the first functional layer may be about 3.0 or more.

The second functional layer may have a step overlapping the pressed area.

A thickness of the second functional layer may be about 25 μm or more.

The second functional layer may not overlap the alignment mark area.

The third functional layer may be in contact with the step of the second functional layer.

The third functional layer may include a transparent epoxy resin.

A thickness of the third functional layer may be about 100 μm or more.

A storage modulus of the third functional layer may be about 500 MPa or more.

The third functional layer may overlap the alignment mark area.

According to an embodiment of the disclosure, a manufacturing method of a display device may include preparing a display panel including a pressed area, a non-pressed area, and an alignment mark area defined on a rear surface overlapping the pressed area; forming a first functional layer on the rear surface of the display panel overlapping the non-pressed area; forming a second functional layer on the rear surface of the display panel overlapping the first functional layer and the pressed area; and forming a third functional layer on the second functional layer overlapping the pressed area.

The forming of the first functional layer may include coating a first ink composition on the rear surface of the display panel overlapping the non-pressed area; and curing a coated first ink composition with ultraviolet rays.

The first ink composition may include an acrylic resin, a photoinitiator, and a light blocking material.

The forming of the second functional layer may include depositing a heat dissipation material on the rear surface of the display panel overlapping the first functional layer and the pressed area while masking the alignment mark area.

In the forming of the second functional layer, a step overlapping the pressed area may be formed in the second functional layer.

The forming of the third functional layer may include coating a second ink composition on the second functional layer overlapping the pressed area and the alignment mark area.

The second ink composition may include a transparent epoxy resin.

The manufacturing method may further include matching a first alignment mark formed on the alignment mark area of the display panel with a second alignment mark formed on a driving chip; and pressing the driving chip on a front surface of the display panel corresponding to an aligned position.

BRIEF DESCRIPTION OF THE DRAWINGS

The above and other features of the disclosure will become more apparent by describing in further detail embodiments thereof with reference to the accompanying drawings, in which:

FIG. 5 is a diagram schematically illustrating a cross section of the display device according to an embodiment.

DETAILED DESCRIPTION OF THE EMBODIMENTS

Figure 1:
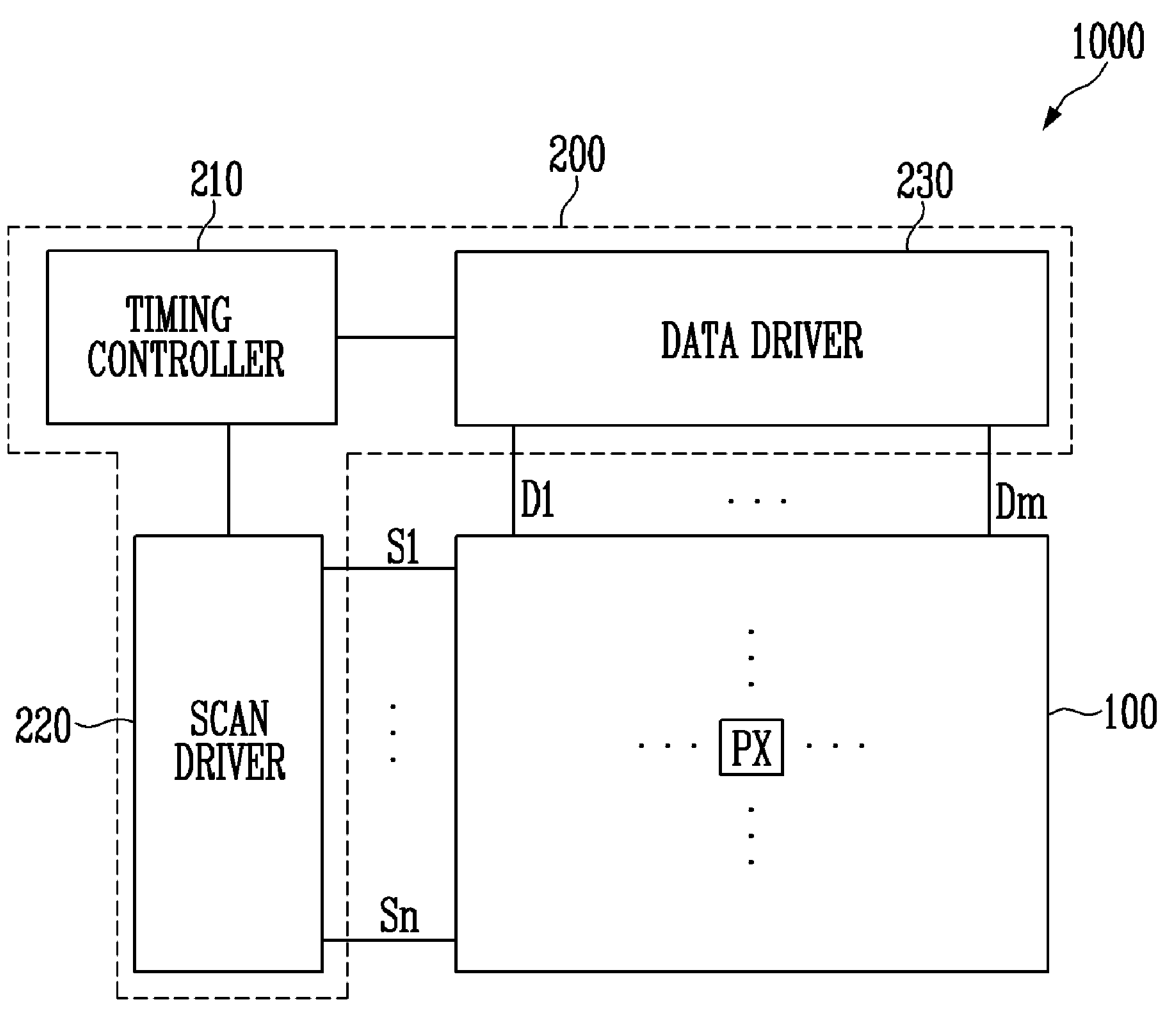
FIG. 1 is a block diagram schematically illustrating a display device according to an embodiment of the disclosure.

Hereinafter, embodiments according to the disclosure will be described in detail with reference to the accompanying drawings. It should be noted that in the following description, only parts necessary for understanding the operation according to the disclosure are described, and descriptions of other parts will be omitted in order not to obscure the subject matter of the disclosure. In addition, the disclosure is not limited to the embodiments described herein and may be embodied in other forms. However, the embodiments described herein are provided to explain in detail so that those skilled in the art can readily practice the technical spirit of the disclosure.

Throughout the specification, when a first part is said to be connected or coupled to a second part, this includes not only a case where the first part and the second part are directly connected or coupled, but also a case where they are indirectly connected or coupled by another element interposed between them. Terms used herein are for describing specific embodiments and are not intended to limit the disclosure. Throughout the specification, when a part includes a certain component, unless the context clearly indicates otherwise, this means that it may further include other components rather than excluding other components. At least one of X, Y, and Z, and at least one selected from the group consisting of X, Y, and Z may be construed as one X, one Y, one Z, or any combination of two or more of X, Y, and Z (for example, XYZ, XYY, YZ, and ZZ). As used herein, the term "and/or" may include any combination of one or more of the corresponding elements.

Although the terms "first", "second", etc. may be used herein to describe various elements, these elements should not be limited by these terms. These terms are only used to distinguish one element from another element. Thus, a first element discussed below could be termed a second element without departing from the scope of the disclosure.

Spatially relative terms such as "beneath", "below", "under", "lower", "above", "upper", "over", and the like may be used herein for descriptive purposes. By doing so, the relationship between one element or feature and another element(s) or feature(s) is explained, as shown in the drawings. Spatially relative terms are intended to include other directions in use, operation, and/or manufacture, in addition to the directions depicted in the drawings. For example, when the device shown in the drawings is turned upside down, elements depicted as being "below" or "beneath" other elements or features are positioned "above" the other elements or features. Thus, in an embodiment, the term "below" may include both directions "above" and "below". In addition, the device may be oriented in other directions (for example, rotated 90 degrees or in other directions). Accordingly, the spatially relative terms used herein may be interpreted accordingly.

Various embodiments are described with reference to the drawings that ideal embodiments are schematically illustrated. Accordingly, it will be expected that their shapes may vary depending, for example, on tolerances and/or manufacturing techniques. Accordingly, the embodiments disclosed herein should not be construed as being limited to the specific shapes shown in the drawings. For example, it should be interpreted to include changes in shape that occur as a result of manufacturing. As such, the shapes shown in the drawings may not illustrate the actual shapes of areas of the device, and the embodiments may not be limited thereto.

The term "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the disclosure will be described in detail with reference to the attached drawings.

FIG. 1 is a block diagram schematically illustrating a display device according to an embodiment of the disclosure.

Referring to FIG. 1, a display device 1000 may include a display panel 100 and a display driver 200.

The display device 1000 may be implemented as a self-emitting light display device including self-emitting light elements. For example, the display device 1000 may be an organic light emitting display device including organic light emitting elements, an inorganic light emitting display device including inorganic light emitting elements, or a display device including light emitting elements composed of a composite of inorganic and organic materials. However, this is an example, and the display device 1000 may be implemented as a liquid crystal display device, a plasma display device, a quantum dot display device, or the like.

The display device 1000 may be a flat panel display device, a flexible display device, a curved display device, a foldable display device, a bendable display device, a slideable display device, or a three-dimensional display device (for example, a display device that displays an image not only on the front, but also on the sides and/or back of the display device).

The display panel 100 may display an image. The display panel 100 may include pixels PX for displaying an image. The pixels PX may be connected to corresponding scan lines S1 to Sn and corresponding data lines D1 to Dm. The pixels PX may be selected by scan signals provided from the scan lines S1 to Sn to emit light with luminance corresponding to data signals provided from the data lines D1 to Dm.

The pixels PX may include first pixels emitting light of a first color, second pixels emitting light of a second color, and third pixels emitting light of a third color. The first color, the second color, and the third color may be different colors. For example, the first color may be one of red, green, and blue, the second color may be one of red, green, and blue other than the first color, and the third color may be one of red, green, and blue other than the first color and the second color. In addition, magenta, cyan, yellow, and the like may be used as the first to third colors.

In the disclosure, the structure, driving method, and the like of the pixels PX are not particularly limited. For example, each of the pixels PX may be implemented and operated using various known structures and driving methods.

The display driver 200 may be electrically connected to the display panel 100 to drive the pixels PX. In an embodiment, the display driver 200 may include a timing controller 210, a scan driver 220, and a data driver 230. However, the disclosure is not limited thereto. The display driver 200 may include the timing controller 210 and the data driver 230, and the scan driver 220 may be separately mounted in a non-display area NDA (see FIG. 2) of the display panel 100.

The timing controller 210 may receive grayscales and timing signals corresponding to each frame period from a processor. The processor may be implemented as a graphics processing unit (GPU), a central processing unit (CPU), an application processor (AP), or the like. Examples of the timing signals may include a vertical synchronization signal, a horizontal synchronization signal, a data enable signal, and the like.

The scan driver 220 may generate the scan signals based on a clock signal, a scan start signal, or the like received from the timing controller 210. The scan driver 220 may sequentially supply the scan signals of a turn-on level to the scan lines S1 to Sn.

The data driver 230 may generate data voltages based on grayscales, a data control signal, or the like received from the timing controller 210. The data driver 230 may supply the data voltages to the data lines D1 to Dm.

Figure 2:
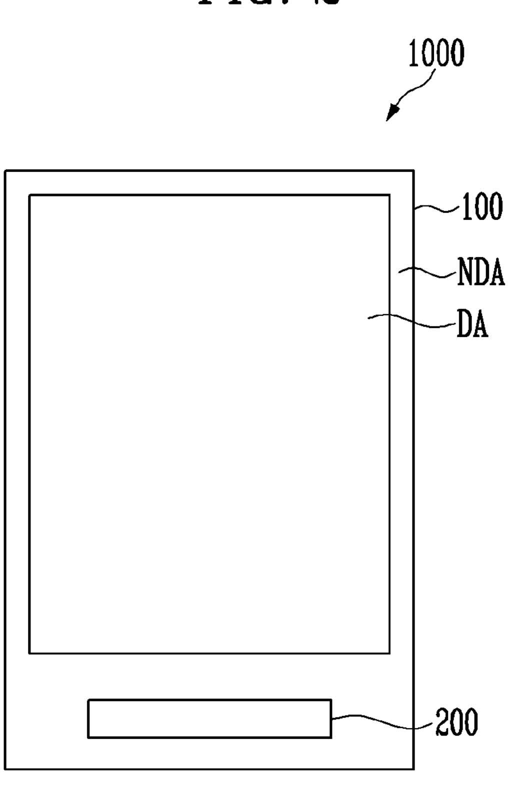
FIG. 2 is a diagram schematically illustrating the display device according to an embodiment of the disclosure.

FIG. 2 is a diagram schematically illustrating the display device according to an embodiment of the disclosure.

Referring to FIG. 2, the display device 1000 may include the display panel 100 and the display driver 200 disposed on the display panel 100.

The display panel 100 may include a display area DA and the non-display area NDA.

The display area DA may be an area in which an image is displayed. The display area DA may have a rectangular shape with right-angled corners. However, the disclosure is not limited thereto, and the display area DA may have a rectangular shape with rounded corners. The shape of the display area DA is not limited to a rectangle. The display area DA may have various shapes, such as circular, oval, or the like. The pixels PX (see FIG. 1) may be arranged in the display area DA.

The non-display area NDA may be an area in which an image is not displayed. The non-display area NDA may surround the display area DA. Wirings, a built-in circuit unit, or the like for driving the pixels PX may be disposed in the non-display area NDA.

The display driver 200 may be disposed in the non-display area NDA. For example, the display driver 200 may be implemented as an integrated circuit (IC) in which the timing controller 210, the scan driver 200, and/or the data driver 230 shown in FIG. 1 are integrated. The display driver 200 may be electrically connected to a printed circuit board and may drive the pixels PX (see FIG. 1) based on signals transmitted from the processor through the printed circuit board.

Hereinafter, for convenience of description, the display driver will be referred to as a driving chip, and the driving chip will be given the same reference numeral as the display driver.

Figure 3:
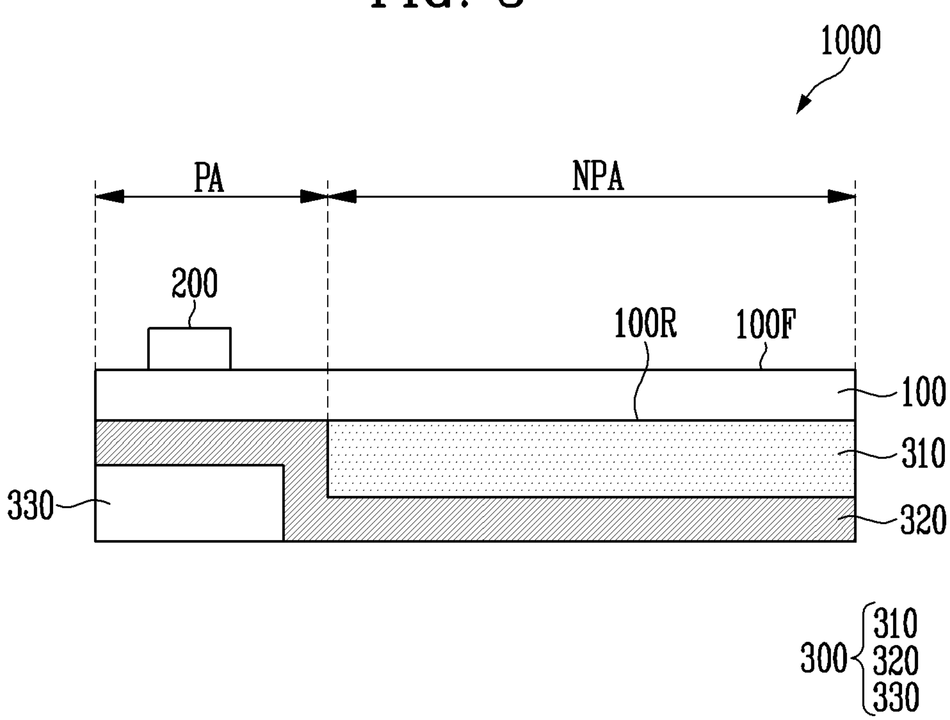
FIG. 3 is a diagram schematically illustrating a cross section of the display device according to an embodiment of the disclosure.

FIG. 3 is a diagram schematically illustrating a cross section of the display device according to an embodiment of the disclosure.

Referring to FIG. 3, the display device 1000 may include a display panel 100, a driving chip 200, and a cover panel 300.

The display panel 100 may include a pressed area PA and a non-pressed area NPA. The pressed area PA may be an area in which the driving chip 200 is disposed in the display panel 100. The pressed area PA may overlap the non-display area NDA shown in FIG. 2. The non-pressed area NPA may be an area in which the driving chip 200 is not disposed in the display panel 100. The non-pressed area NPA may overlap the display area DA and the non-display area NDA shown in FIG. 2.

The driving chip 200 may be disposed on a front surface 100F of the display panel 100 overlapping the pressed area PA.

The cover panel 300 may be disposed on a rear surface 100R of the display panel 100. For example, the cover panel 300 may be disposed on the rear surface 100R of the display panel 100 overlapping the pressed area PA and the non-pressed area NPA. The cover panel 300 may have light blocking, impact resistance, and heat dissipation properties, and may have a thin thickness to reduce the thickness of the display device 1000. In an embodiment, the thickness of the cover panel 300 may be about 150 μm or less.

In an embodiment, the cover panel 300 may include a first functional layer 310, a second functional layer 320, and/or a third functional layer 330.

The first functional layer 310 may be disposed on the rear surface 100R of the display panel 100. For example, the first functional layer 310 may be disposed on the rear surface 100R of the display panel 100 overlapping the non-pressed area NPA. Accordingly, the first functional layer 310 may overlap the non-pressed area NPA but may not overlap the pressed area PA.

The first functional layer 310 may have light blocking properties. For example, the first functional layer 310 may block external light from entering the display panel 100. In an embodiment, an optical density value of the first functional layer 310 may be about 3.0 or more.

Since the first functional layer 310 may be disposed on the rear surface 100R of the display panel 100 overlapping the non-pressed area NPA, alignment of the display panel 100 and the driving chip 200 may be possible. For example, in case that the first functional layer 310 is disposed on the rear surface 100R of the display panel 100 overlapping the pressed area PA, since light for recognizing an alignment mark AM1 of the display panel 100 and an alignment mark AM2 of the driving chip 200 shown in FIG. 5 may be blocked by the first functional layer 310, alignment of the display panel 100 and the driving chip 200 may be impossible.

The first functional layer 310 may have impact resistance properties. For example, the first functional layer 310 may absorb an external impact to minimize the amount of impact transmitted to the display panel 100. In an embodiment, in case that an external impact is applied, the amount of impact transmitted from the first functional layer 310 to the display panel 100 may be about 36 MPa or less. Accordingly, damage to the display panel 100 can be prevented. Experimentally, after fixing the first functional layer 100 on a pressure-sensitive paper, in case that a about 2 g steel ball is dropped from a height of about 10 cm, a maximum value of the amount of impact transmitted to the pressure-sensitive paper was found to be about 35.6 Mpa, and a minimum value was found to be about 15.6 Mpa.

The first functional layer 310 may include, e.g., an acrylic resin, a photoinitiator, or a light blocking material. In the disclosure, any acrylic resin that exhibits the above-mentioned impact resistance properties can be used without limitation in its type. The light blocking material may include an ultraviolet-transmitting type black pigment. For example, the light blocking material may include carbon black, titanium black, or the like. However, the disclosure is not limited thereto, and any light blocking material that exhibits the above-mentioned light blocking properties can be used without limitation in its type.

The second functional layer 320 may be disposed on the first functional layer 310 and the rear surface 100R of the display panel 100. For example, the second functional layer 320 may be disposed on the first functional layer 310 overlapping the non-pressed area NPA. The second functional layer 320 may extending along the first functional layer 310 and may be disposed on the rear surface 100R of the display panel 100 overlapping the pressed area PA. Accordingly, the second functional layer 320 may have a step (e.g., a structure having a step difference or height difference) that overlaps the pressed area PA. For example, in the second functional layer 320, a step may be formed between a portion overlapping the pressed area PA and a portion overlapping the non-pressed area NPA. In an embodiment, the thickness of the second functional layer 320 may be about 25 μm or more.

The second functional layer 320 may have heat dissipation properties. For example, the second functional layer 320 may remove heat generated from the driving chip 200. In particular, since the second functional layer 320 may be disposed on the rear surface 100R of the display panel 100 where the driving chip 200 is disposed, that is, on the rear surface 100R of the display panel 100 overlapping the pressed area PA, heat generated from the driving chip 200 can be effectively removed. The second functional layer 320 may remove heat generated from the processor. The second functional layer 320 may include a heat dissipation material HDM (see FIG. 7). For example, the heat dissipation material HDM may include a metal material with high thermal conductivity such as copper, nickel, ferrite, silver, aluminum, or the like.

The third functional layer 330 may be disposed on the second functional layer 320. For example, the third functional layer 330 may be disposed on the second functional layer 320 overlapping the pressed area PA. The third functional layer 330 may be in contact with the step of the second functional layer 320. For example, an inner surface of the third functional layer 330 may be in contact with the step of the second functional layer 320. In an embodiment, the thickness of the third functional layer 330 may be about 100 μm or more.

The third functional layer 330 may prevent deformation of the display panel 100. For example, the third functional layer 330 may prevent the display panel 100 from being pressed in case that the driving chip 200 is pressed to the display panel 100. In an embodiment, a storage modulus of the third functional layer 330 may be about 500 Mpa or more. If the above-mentioned range is met, in case that the driving chip 200 is pressed to the display panel 100, the strain (or tensile) of the display panel 100 may be about 0.8% or less. Accordingly, it is possible to prevent cracks from occurring in the display panel 100 (or wirings).

The third functional layer 330 may be transparent. In case that the third functional layer 330 is transparent, since light for recognizing the alignment mark AM1 of the display panel 100 and the alignment mark AM2 of the driving chip 200 shown in FIG. 9 may pass through the third functional layer 300, alignment of the display panel 100 and the driving chip 200 may be possible. The third functional layer 330 may include a high-strength resin. For example, the third functional layer 330 may include a transparent epoxy resin. In the disclosure, any transparent epoxy resin that exhibits the storage modulus described above can be used without limitation in its type.

Figure 4:
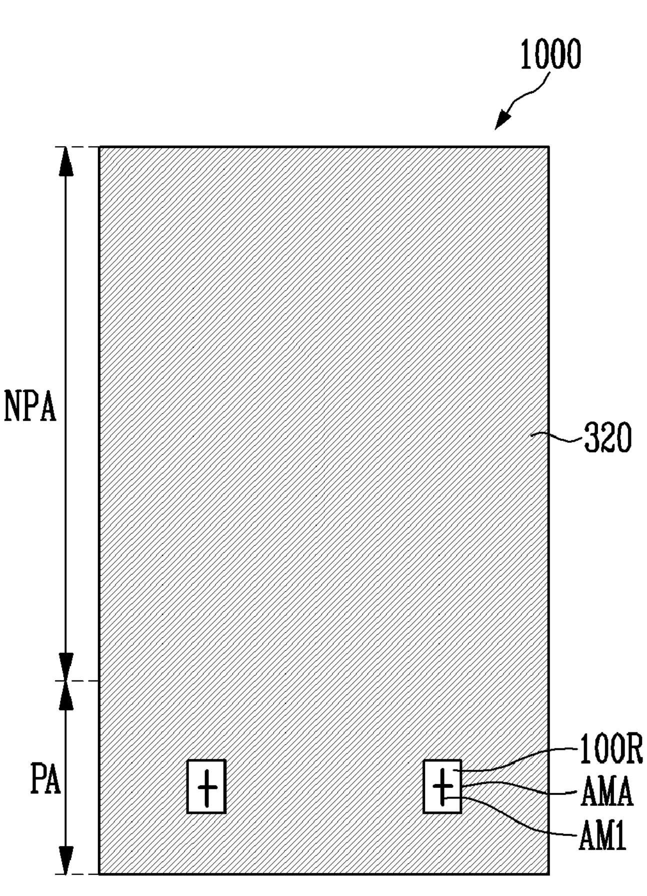
FIG. 4 is a diagram schematically illustrating a rear surface of the display device shown in FIG. 3.

FIG. 4 is a diagram schematically illustrating a rear surface of the display device shown in FIG. 3. For convenience of description, the third functional layer 330 shown in FIG. 3 is omitted in FIG. 4.

Referring to FIG. 4, the display panel 100 (see FIG. 3) may further include an alignment mark area AMA. For example, the alignment mark area AMA may be defined on the rear surface 100R of the display panel 100 overlapping the pressed area PA. The alignment mark area AMA may refer to an area (e.g., a predetermined or selected area) including the alignment mark AMI of the display panel 100.

In an embodiment, the second functional layer 320 may be disposed on the rear surface 100R of the display panel 100 overlapping the pressed area PA excluding the alignment mark area AMA. The second functional layer 320 may not overlap the alignment mark area AMA. Since the second functional layer 320 does not overlap the alignment mark area AMA, alignment of the display panel 100 and the driving chip 200 may be possible. For example, in case that the second functional layer 320 overlaps the alignment mark area AMA, since light for recognizing the alignment mark AMI of the display panel 100 and the alignment mark AM2 of the driving chip 200 shown in FIG. 5 may be blocked by the second functional layer 320, alignment of the display panel 100 and the driving chip 200 may be impossible.

FIG. 5 is a diagram schematically illustrating a cross section of the display device according to an embodiment. In FIG. 5, unlike FIG. 3, a cross-section of the display device 1000 including the alignment mark AMI of the display panel 100 and the alignment mark AM2 of the driving chip 200 is schematically shown. Repetitive content with respect to the content described in FIG. 5 will be briefly explained or omitted.

Referring to FIG. 5, the third functional layer 330 may be disposed on the rear surface 100R of the display panel 100 overlapping the alignment mark area AMA. The third functional layer 330 may overlap the alignment mark area AMA. For example, the third functional layer 330 may fill the exposed alignment mark area AMA. Even if the alignment mark area AMA is filled with the third functional layer 330, since the third functional layer 330 may be transparent, light for recognizing the alignment mark AM1 of the display panel 100 and the alignment mark AM2 of the driving chip 200 may pass through the third functional layer 330. Therefore, alignment of the display panel 100 and the driving chip 200 may be possible. Accordingly, the driving chip 200 may be disposed on the front surface 100F of the display panel 100 where the alignment mark AM1 of the display panel 100 may match the alignment mark AM2 of the driving chip 200.

FIGS. 6 to 10 are diagrams schematically illustrating a manufacturing method of a display device according to an embodiment. In FIGS. 6 to 10, repetitive content with respect to the above-described content will be briefly explained or omitted.

Figure 6:
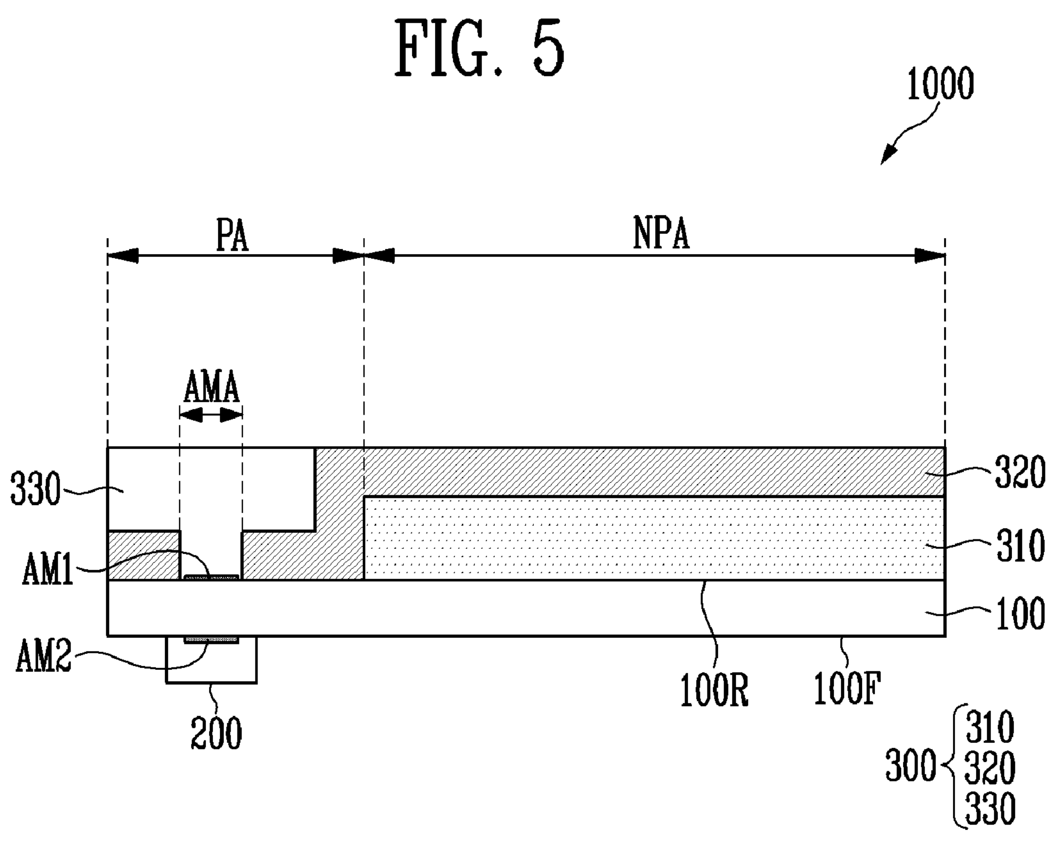
FIGS. 6 to 10 are diagrams schematically illustrating a manufacturing method of a display device according to an embodiment.

Referring to FIG. 6, a display panel 100 including a pressed area PA, a non-pressed area NPA, and an alignment mark AM1 may be prepared. The alignment mark AM1 may be formed on a rear surface 100R of the display panel 100 overlapping the pressed area PA.

A first functional layer 310 may be formed on the rear surface 100R of the display panel 100 overlapping the non-pressed area NPA. For example, a first ink composition INK1 may be coated on the rear surface 100R of the display panel 100 overlapping the non-pressed area NPA using an inkjet device ID. In an embodiment, the first ink composition INK1 may include an acrylic resin, a photoinitiator, and a light blocking material. Thereafter, the coated first ink composition INK1 may be cured with ultraviolet rays UV. In case that ultraviolet rays UV are irradiated on the coated first ink composition INK1, the monomer and oligomer contained in the acrylic resin react with the photoinitiator and harden, thereby forming the first functional layer 310 having impact resistance properties. Since the light blocking material may include an ultraviolet-transmitting type black pigment, the acrylic resin can be readily cured with ultraviolet rays, and the first functional layer 310 having the above-mentioned light blocking properties can be formed.

Figure 7:
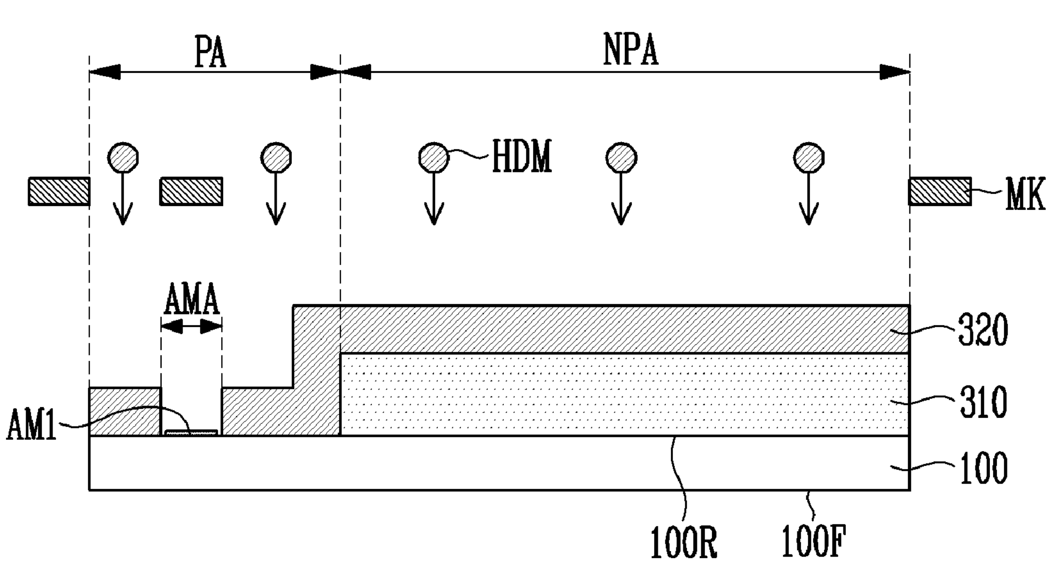

Referring to FIG. 7, a second functional layer 320 may be formed on the first functional layer 310 and the rear surface 100R of the display panel 100 overlapping the pressed area PA excluding the alignment mark area AMA. For example, a heat dissipation material HDM may be deposited on the rear surface 100R of the display panel 100 overlapping the pressed area PA excluding the alignment mark area AMA using a mask MK having a masking portion for masking the alignment mark area AMA. The heat dissipation material HDM may be deposited on the first functional layer 310 overlapping the non-pressed area NPA using a mask MK having an opening exposing the first functional layer 310. The second functional layer 320 may be formed by depositing the heat dissipation material HDM through a sputtering type physical vapor deposition (PVD) method, a chemical vapor deposition (CVD) method using plasma, or the like, but the disclosure is not limited thereto.

Figure 8:
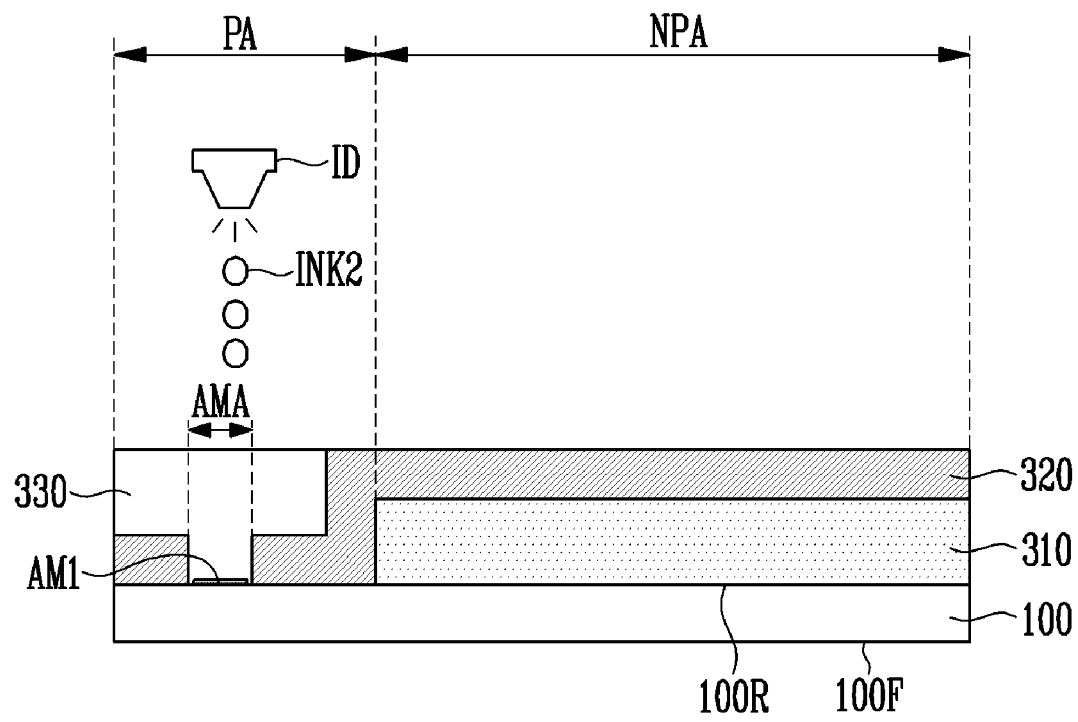

Referring to FIG. 8, a third functional layer 330 may be formed on the second functional layer 320 overlapping the pressed area PA and the rear surface 100R of the display panel 100 overlapping the alignment mark area AMA. For example, a second ink composition INK2 may be coated on the second functional layer 320 overlapping the pressed area PA using an inkjet device ID. The second ink composition INK2 may be coated to a thickness corresponding to the step of the second functional layer 320. The second ink composition INK2 may be coated on the rear surface 100R of the display panel 100 overlapping the alignment mark area AMA using the inkjet device ID. Accordingly, the exposed alignment mark area AMA may be filled with the second ink composition INK2. In an embodiment, the second ink composition INK1 may include a transparent epoxy resin.

Figure 9:
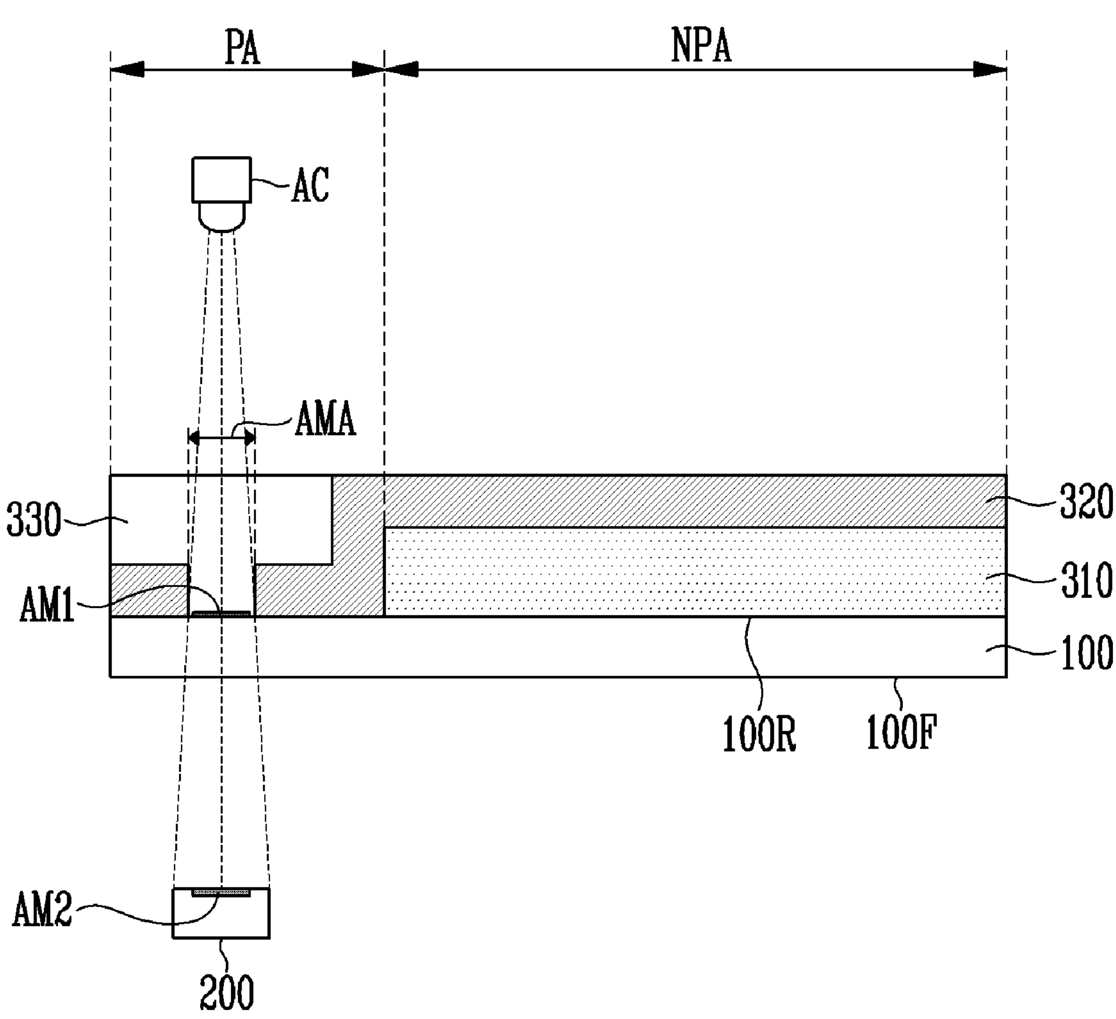

Referring to FIG. 9, the display panel 100 and the driving chip 200 may be aligned. For example, the alignment mark AM1 of the display panel 100 and an alignment mark AM2 of the driving chip 200 may be aligned using an alignment camera AC. Since the transparent third functional layer 330 may be formed instead of the second functional layer 320 in the alignment mark area AMA including the alignment mark AM1 of the display panel 100, alignment of the display panel 100 and the driving chip 200 may be possible through light emitted from the alignment camera AC.

Figure 10:
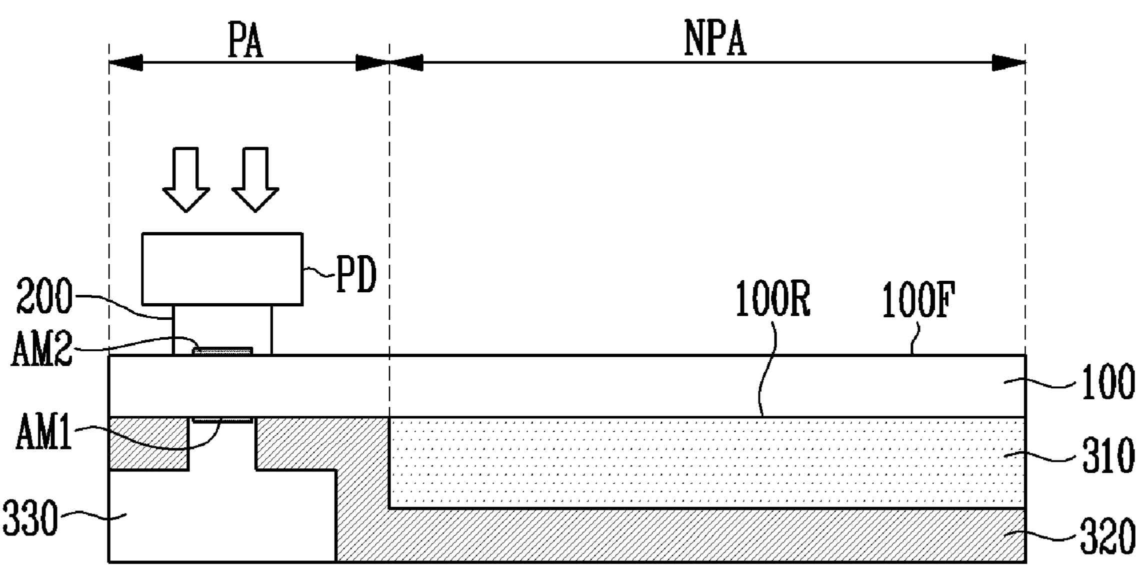

Referring to FIG. 10, the driving chip 200 may be pressed (attached) on a front surface 100F of the display panel 100 overlapping the pressed area PA. For example, the driving chip 200 may be pressed (attached) onto the front surface 100F of the display panel 100 corresponding to the aligned position using a pressing device PD. Since the high-strength third functional layer 330 is located on the rear surface 100R of the display panel 100 overlapping the pressed area PA, in case that the driving chip 200 is pressed (attached) onto the display panel 100, cracks in the display panel 100 (or wirings) can be prevented.

According to the embodiments of the disclosure, a display device that can have a thin thickness and improved light blocking and impact resistance properties, and a manufacturing method thereof can be provided.

A display device that can readily align a display panel and a driving chip, and a manufacturing method thereof can be provided.

A display device that can prevent cracks in a display panel in case that a driving chip is pressed to the display panel, and a manufacturing method thereof can be provided.

However, effects of the disclosure are not limited to the above-described effects, and may be variously extended without departing from the spirit and scope of the disclosure.

The above description is an example of technical features of the disclosure, and those skilled in the art to which the disclosure pertains will be able to make various modifications and variations. Thus, the embodiments of the disclosure described above may be implemented separately or in combination with each other.

The embodiments disclosed in the disclosure are intended not to limit the technical spirit of the disclosure but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:

a display panel including a pressed area, a non-pressed area, and an alignment mark area defined on a rear surface overlapping the pressed area;

a driving chip disposed on a front surface of the display panel overlapping the pressed area; and a cover panel disposed on the rear surface of the display panel, wherein the cover panel includes:

a first functional layer disposed on the rear surface of the display panel overlapping the non-pressed area;

a second functional layer disposed on the first functional layer, extending along the first functional layer, and disposed on the rear surface of the display panel overlapping the pressed area; and a third functional layer disposed on the second functional layer overlapping the pressed area.

2. The display device of claim 1, wherein the first functional layer does not overlap the pressed area.

3. The display device of claim 1, wherein the first functional layer includes an acrylic resin, a photoinitiator, and a light blocking material.

4. The display device of claim 1, wherein an optical density value of the first functional layer is about 3.0 or more.

5. The display device of claim 1, wherein the second functional layer has a step overlapping the pressed area.

6. The display device of claim 1, wherein a thickness of the second functional layer is about 25 μm or more.

7. The display device of claim 1, wherein the second functional layer does not overlap the alignment mark area.

8. The display device of claim 5, wherein the third functional layer is in contact with the step of the second functional layer.

9. The display device of claim 1, wherein the third functional layer includes a transparent epoxy resin.

10. The display device of claim 1, wherein a thickness of the third functional layer is about 100 μm or more.

11. The display device of claim 1, wherein a storage modulus of the third functional layer is about 500 MPa or more.

12. The display device of claim 1, wherein the third functional layer overlaps the alignment mark area.

13. A manufacturing method of a display device comprising:

preparing a display panel including a pressed area, a non-pressed area, and an alignment mark area defined on a rear surface overlapping the pressed area;

forming a first functional layer on the rear surface of the display panel overlapping the non-pressed area;

forming a second functional layer on the rear surface of the display panel overlapping the first functional layer and the pressed area; and forming a third functional layer on the second functional layer overlapping the pressed area.

14. The manufacturing method of claim 13, wherein the forming of the first functional layer includes:

coating a first ink composition on the rear surface of the display panel overlapping the non-pressed area; and curing a coated first ink composition with ultraviolet rays.

15. The manufacturing method of claim 14, wherein the first ink composition includes an acrylic resin, a photoinitiator, and a light blocking material.

16. The manufacturing method of claim 13, wherein the forming of the second functional layer includes:

depositing a heat dissipation material on the rear surface of the display panel overlapping the first functional layer and the pressed area while masking the alignment mark area.

17. The manufacturing method of claim 13, wherein in the forming of the second functional layer, a step overlapping the pressed area is formed in the second functional layer.

18. The manufacturing method of claim 13, wherein the forming of the third functional layer includes:

coating a second ink composition on the second functional layer overlapping the pressed area and the alignment mark area.

19. The manufacturing method of claim 18, wherein the second ink composition includes a transparent epoxy resin.

20. The manufacturing method of claim 13, further comprising:

matching a first alignment mark formed on the alignment mark area of the display panel with a second alignment mark formed on a driving chip; and pressing the driving chip on a front surface of the display panel corresponding to an aligned position.

* * * * *